United States Patent [19]

Mori

[11] Patent Number: 5,389,880
[45] Date of Patent: Feb. 14, 1995

[54] MAGNETIC RESONANCE IMAGING APPARATUS

[75] Inventor: Issei Mori, Tochigi, Japan

[73] Assignee: Kabushiki Kaisha Toshiba, Kanagawa, Japan

[21] Appl. No.: 85,742

[22] Filed: Jun. 30, 1993

[30] Foreign Application Priority Data

Jun. 30, 1992 [JP] Japan .................................. 4-172539

[51] Int. Cl.$^6$ ............................................ G01R 33/20
[52] U.S. Cl. ..................................................... 324/318
[58] Field of Search ............... 324/300, 307, 309, 310, 324/311, 312, 306, 313, 314, 318, 322

[56] References Cited

U.S. PATENT DOCUMENTS

| | | | |
|---|---|---|---|
| 4,574,239 | 3/1986 | Singer | 324/306 |
| 4,574,240 | 3/1986 | Libove et al. | 324/309 |
| 4,683,431 | 7/1987 | Pattany et al. | 324/309 |
| 4,694,254 | 9/1987 | Vatis et al. | 324/309 |
| 5,204,625 | 4/1993 | Cline et al. | 324/309 |
| 5,226,418 | 7/1993 | Bernstein et al. | 128/653.3 |
| 5,260,654 | 11/1993 | Cory | 324/309 |

*Primary Examiner*—Michael J. Tokar
*Attorney, Agent, or Firm*—Limbach & Limbach

[57] ABSTRACT

Four QD surface coil assemblies each constituted by an 8-shaped coil and a rectangular coil are one-dimensionally arranged under the spine array of a patient in the direction of the body axis of the patient. Each 8-shaped coil senses an RF magnetic field in an x direction near the spine array of the patient, and each rectangular coil senses an RF magnetic field in a y direction. Outputs from the 8-shaped coils and the rectangular coils are input to 90° hybrid combiner circuits through pre-amplifiers, the phase of any one of the outputs is shifted by 90°, and then the outputs are added to each other. Outputs from the 90° hybrid combiner circuits are supplied as raw data, through receiver/data acquisition systems, to a data processing unit (computer). In the data processing unit, raw data are two-dimensionally Fourier-transformed to form image signals $p_i(x,y,z)$ ($i = 1$ to 4). The signals $p_i(x,y,z)$ are squared, the sum of $p_i(x,y,z)$ is calculated with respect to i, and finally, the square root of the sum is calculated to obtain an image.

12 Claims, 9 Drawing Sheets

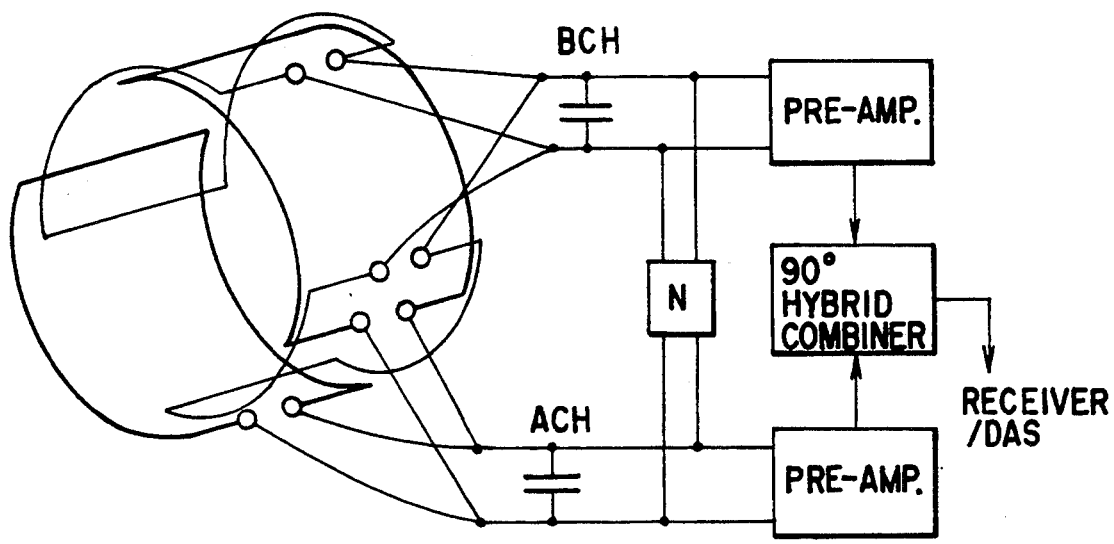
F I G. 13
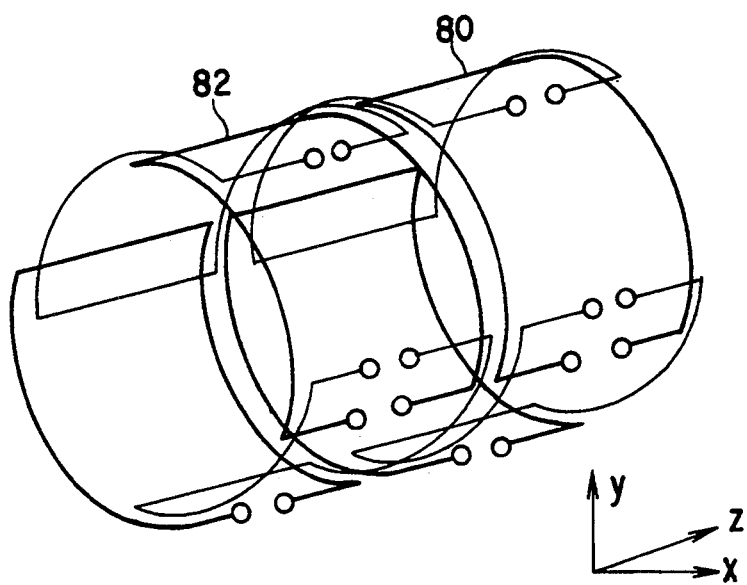
F I G. 14

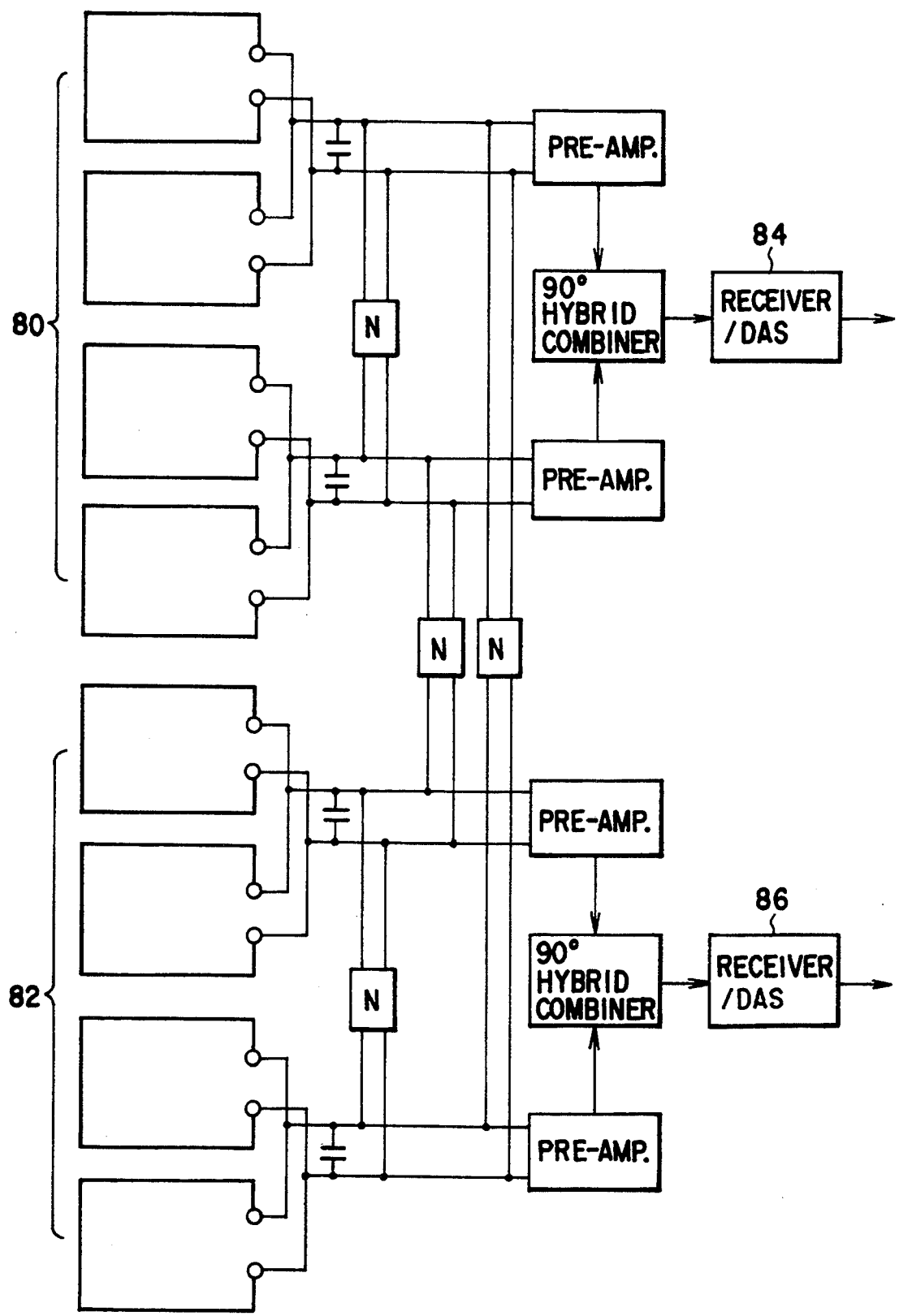
F I G. 15

MAGNETIC RESONANCE IMAGING APPARATUS

BACKGROUND OF THE INVENTION

1. Field of the Invention

The present invention relates to a magnetic resonance imaging apparatus (to be referred to as an MRI apparatus hereinafter) and, more particularly, to improvement of a radio-frequency coil (to be referred to as an RF coil hereinafter) for receiving a magnetic resonance signal (to be referred to as an MR signal hereinafter) from an object to be imaged or examined.

2. Description of the Related Art

As an example of such an RF coil, a surface coil, mainly used for spine array imaging, for obtaining an MR signal from a surface region of the object near the coil is known. It is generally known that a signal-to-noise ratio (to be referred to as an S/N ratio hereinafter) is improved when a plurality of small surface coils are used in place of one large surface coil. An apparatus using these small surface coils is described in U.S. Pat. No. 4,825,162 (Roemer et al.), "The NMR Phased Array", MAGNETIC RESONANCE IN MEDICINE 16, 192-225 (1990), and U.S. Pat. No. 5,086,275 (Roemer). According to these prior arts, a plurality of surface coils are one-dimensionally arranged, the surface coils are simultaneously operated to receive the MR signals, images are reconstructed from the respective output signals from surface coils, and the images are synthesized to obtain one image. This surface coil array is called an MRI phased array coil because the above operation is similar to that of a phased array antenna in an antenna technique.

Another prior art of the MRI phased array coil is described in "Volume Imaging with MR Phased Arrays", MAGNETIC RESONANCE IN MEDICINE 18, 309-319 (1991). This prior art relates to a phased array for abdominal imaging and is constituted by four surface coils covering an abdomen of the object.

In order to further improve an S/N ratio, a method of two-dimensionally arranging surface coils is described in the above United States Patents.

However, when the surface coils are two-dimensionally arranged, the number of surface coils is considerably increased. For example, the number of surface coils of a two-dimensional array which can cover the same field as that of a one-dimensional array constituted by four surface coils reaches 10. Consequently, 10 receivers and 10 data acquisition systems (to be referred to as DASs hereinafter) which process MR signals are required. The receivers and DASs include high-speed and high-precision A/D converters, and the cost of the receivers and DASs is increased. Therefore, a large number of receivers and DASs are not practically arranged. In addition, when data are simultaneously acquired by 10 surface coils, the amount of data exceeds the processing capacity of a data processing system depending on a pulse sequence used in this data processing. In this case, a buffer memory having a large capacity (e.g., 100 MB or more) must be additionally arranged, thereby increasing the cost. Furthermore, since a synthesized image is formed such that a set of 10 data are subject to some processing, a time required for the forming the synthesized image is 10 times a time required for reconstructing an image from raw data received by a normal single RF coil. A decrease in time required for reconstructing an image to improve the operating efficiency of a prevailing MRI apparatus is an important target. Therefore, it is not desirable to increase the reconstruction time even though an S/N ratio is improved.

Another method of using a quadrature surface coil (to be referred to as a QD surface coil hereinafter) to further improve an S/N ratio is described in U.S. Pat. No. 4,721,913 (Hyde et al.). However, a sufficient S/N ratio for a large field cannot be obtained by merely using the QD surface coil. The QD surface coil has an S/N ratio 1.3 times higher than that obtained by the non-QD surface coil covering the same field. However, when the field is enlarged, it is easy to acquire a noise originated from the object and an S/N ratio is degraded. Even in the case of the QD surface coil, a trade-off between the width or length of the field and the S/N ratio cannot be avoided.

Another prior art is described in a copending U.S. patent application Ser. No. 07/701,025 (Mori), "Multiple Coil Type Magnetic Resonance Imaging System including Filters with Different Passbands", filed Jul. 16, 1991 and assigned to the same assignee as that of the present invention. This application relates to a different technique other than the phased array to keep an S/N ratio at a high level for a long field. Plural surface coils are one-dimensionally arranged as in the MR phased array coil. The plural coils are arranged in a frequency encoding direction. Narrow band band-pass filters are respectively connected to the outputs of the coils, the outputs of the filters are synthesized, and the synthesized signal is subject to detection, A/D conversion, and data acquisition processings. According to this scheme, there is no need to provide additional data acquisition channels and to increase data processing ability so that the similar performance as that of the MR phased array coil is obtained in the case of the spine array imaging. However, this scheme has such a restriction that the coils must be arranged in a frequency encoding direction. Therefore, this scheme cannot be applied to other imagings than the spine array imaging. There is no such a restriction in the case of the MRI phased array coil.

SUMMARY OF THE INVENTION

As described above, a conventional MRI phased array coil constituted by one-dimensionally arranged surface coils cannot have a sufficiently high S/N ratio. In a conventional MRI phased array coil constituted by two-dimensionally arranged surface coils, the number of channels of data acquisition and an amount of data are increased in proportion to the number of coils. A highcost system is required to overcome this drawback, or a time required for data processing is disadvantageously prolonged. Even if a QD surface coil is used, a sufficiently high S/N ratio cannot be obtained for a large field.

Accordingly, it is an object of the present invention to provide a magnetic resonance imaging apparatus capable of reconstructing an image having a high S/N ratio with a simple arrangement for a short time.

According to the present invention, there is provided a magnetic resonance imaging apparatus comprising:

a radio-frequency coil array formed of at least two radio-frequency coil assemblies arranged in at least one dimension, each of the radio-frequency coil assemblies having a sensitivity in directions of two radio-frequency magnetic fields perpendicular to each other at a predetermined portion of an object to be imaged and detecting two signals corresponding to the two radio-frequency magnetic fields;

means for shifting a phase of one of two output signals from each of the radio-frequency coil assemblies with respect to a phase of the other by about 90° and synthesizing the two output signals to obtain one signal;

means for substantially simultaneously operating the at least two radio-frequency coil assemblies to substantially simultaneously acquire at least two synthesized signals; and means for reconstructing an image of the object on the basis of the at least two synthesized signals which are simultaneously acquired.

According to the present invention, there is provided another magnetic resonance imaging apparatus comprising:

a radio-frequency coil array formed of at least two pairs of radio-frequency coil assemblies arranged in at least one dimension, each of the pair of the radio-frequency coil assemblies sandwiching an object to be imaged, having a sensitivity in directions of two radio-frequency magnetic fields perpendicular to each other at a predetermined portion of the object, and detecting two signals corresponding to the two radio-frequency magnetic fields;

means for shifting a phase of one of two output signals from each of the pairs of the radio-frequency coil assemblies with respect to a phase of the other by about 90° and synthesizing the two output signals to obtain one signal;

means for substantially simultaneously operating the at least two pairs of the radio-frequency coil assemblies to substantially simultaneously acquire the plurality of synthesized signals; and means for reconstructing an image of the object on the basis of the plurality of synthesized signals which are simultaneously acquired.

According to the present invention, there is provided a still another magnetic resonance imaging apparatus comprising:

plural volume coil assemblies arranged in a direction of a body axis of an object to be imaged to surround the object;

means for substantially simultaneously operating the plural volume coil assemblies to substantially simultaneously acquire plural output signals from the plural volume coil assemblies; and means for reconstructing an image of the object on the basis of the plural output signals from the plural volume coil assemblies which are simultaneously acquired.

According to the present invention, there is provided a further magnetic resonance imaging apparatus comprising:

a radio-frequency volume coil array formed of at least two radio-frequency volume coil assemblies arranged in a direction of a body axis of an object to be imaged, each of the radio-frequency volume coil assemblies being formed of two radio-frequency coil assemblies sandwiching the object, and each of the volume radio-frequency coil assemblies having a sensitivity in directions of two radio-frequency magnetic fields perpendicular to each other at a predetermined portion of the object and detecting two signals corresponding to the two radio-frequency magnetic fields;

means for shifting a phase of one of two output signals from each of the radio-frequency volume coil assemblies with respect to a phase of the other by about 90° and synthesizing the two output signals to obtain one signal;

means for substantially simultaneously operating the at least two radio-frequency volume coil assemblies to substantially simultaneously acquire the plurality of synthesized signals; and means for reconstructing an image of the object on the basis of the plurality of synthesized signals which are simultaneously acquired.

According to the present invention, there is provided a still further magnetic resonance imaging apparatus comprising:

a radio-frequency surface coil assembly formed of two radio-frequency surface coil assemblies, having a sensitivity in directions of two radio-frequency magnetic fields perpendicular to each other at a predetermined portion of an object to be imaged and detecting two signals corresponding to the two radio-frequency magnetic fields;

a radio-frequency volume coil assembly formed of two radio-frequency coil assemblies surrounding the object, having a sensitivity in directions of two radio-frequency magnetic fields perpendicular to each other at a predetermined portion of the object and detecting two signals corresponding to the two radio-frequency magnetic fields;

first synthesizing means for shifting a phase of one of two output signals from the radio-frequency surface coil assembly with respect to a phase of the other by about 90° and synthesizing the two output signals to obtain one signal;

second synthesizing means for shifting a phase of one of two output signals from the radio-frequency volume coil assembly with respect to a phase of the other by about 90° and synthesizing the two output signals to obtain one signal;

means for substantially simultaneously operating the radio-frequency surface coil assembly and the radio-frequency volume coil assembly to substantially simultaneously acquire the synthesized signals; and means for reconstructing an image of the object on the basis of the synthesized signals which are simultaneously acquired.

According to the present invention, an RF coil group in which QD surface coil assemblies or QD volume coil assemblies are one-dimensionally arranged in the direction of the body axis of the object is used, two signals from the coil elements forming a QD coil assembly are synthesized to obtain one signal, and an image is reconstructed on the basis of the synthesized signal. In this manner, there is provided a magnetic resonance imaging apparatus capable of obtaining an image having an amount of acquisition data and an amount of processing data which are less than half those of an image obtained when only one of the two coil elements constituting the QD coil assembly is two-dimensionally arranged and signals from the coil elements are independently acquired to reconstruct the image. The S/N ratio of the image obtained according to the present invention is equal to that of the image obtained when coil elements are two-dimensionally arranged.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 13 is a view showing a conventional arrangement of a volume quadrature coil assembly;

FIG. 14 is a view showing the arrangement of a volume quadrature coil assembly in a magnetic resonance imaging apparatus according to a third embodiment of the present invention;

FIG. 15 is a block diagram showing a circuit arrangement of the third embodiment;

DETAILED DESCRIPTION OF THE PREFERRED EMBODIMENTS

A preferred embodiment of a magnetic resonance imaging apparatus according to the present invention will now be described with reference to the accompanying drawings.

Figure 1:
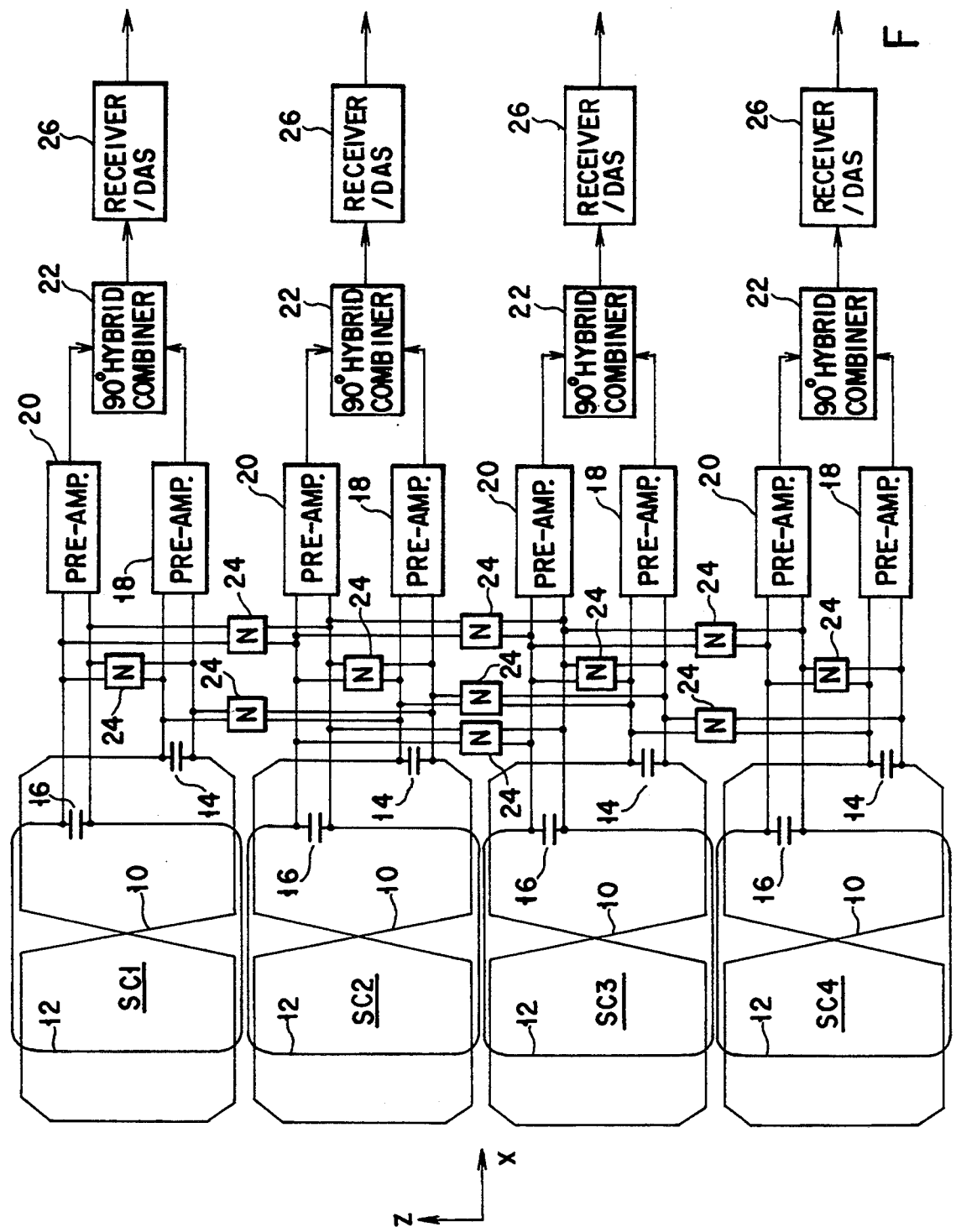
FIG. 1 is a block diagram showing the arrangement of RF coils in a magnetic resonance imaging apparatus according to a first embodiment of the present invention.

FIG. 1 is a block diagram showing an arrangement of RF coils according to the first embodiment. In the first embodiment, it is assumed that a spine array is imaged. Four RF coil assemblies $SC_1$ to $SC_4$ are one-dimensionally arranged in a z-axis direction, thereby forming an RF coil group for an MR phased array. The z-axis direction is a static field direction, and is the direction of the axis of an object to be examined (patient). The patient horizontally lies on a bed (not shown). The RF coil group is arranged between the patient and the bed. A horizontal direction perpendicular to the z-axis is set to be an x-axis direction, and the vertical direction perpendicular to the z-axis is set to be a y-axis direction. The central position of the RF coil group is set to be x=0.

Each of the RF coil assemblies $SC_i$ (i=1 to 4) is a QD surface coil assembly constituted by combining an 8-shaped surface coil 10 and a rectangular surface coil 12. The 8-shaped surface coil 10 has a sensitivity in an x-direction RF magnetic field near the spine array of the patient, and the rectangular coil 12 has a sensitivity in a y-direction RF magnetic field at the same position. When a static magnetic field and gradient magnetic field respectively generated by static and gradient field generators (not shown) and an RF magnetic field generated by an excitation RF coil (not shown) are applied to the object, a magnetic resonance phenomenon occurs in the object, and x- and y-direction components of an MR signal generated by the magnetic resonance phenomenon are detected by the coils 10 and 12, respectively.

Tuning circuits represented by capacitors 14 and 16 are connected to the coils 10 and 12, respectively. The capacitors 14 and 16 form LC resonance circuits together with inductances of the coils 10 and 12. Terminal voltages are output from the capacitors 14 and 16. Outputs from the coils 10 and 12 are input to a 90° hybrid combiner 22 through pre-amplifiers 18 and 20, respectively. The phases of the outputs from the coils 10 and 12 are shifted from each other by 90°. The 90° hybrid combiner 22 shifts the phase of one of the inputs by 90°, and the inputs are added to each other. Due to this addition, the amplitudes of the signal components of both the inputs are doubled because the signal components are correlated. However, the amplitudes of the noise components of the inputs become $\sqrt{2}$ because the noise components are not correlated, thereby relatively reducing noise.

Figure 2:
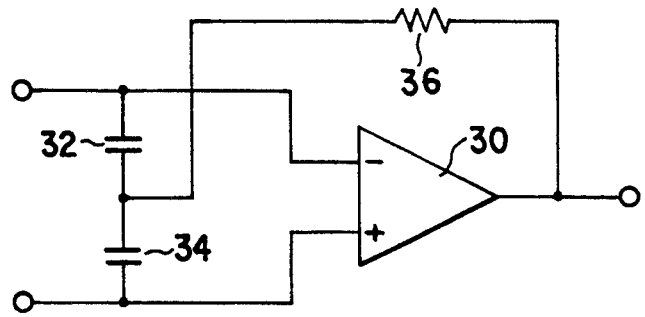
FIG. 2 is a view showing the arrangement of a pre-amplifier according to the first embodiment.

Each of pre-amplifiers 18 and 20 is constituted by a resistance negative feedback type amplifier as shown in FIG. 2, and has not only an amplification function but a function of reducing interference between coils. An input signal is output through an operational amplifier 30. A capacitive current distributor constituted by series-connecting capacitors 32 and 34 is connected between both the input terminals of the operational amplifier 30, and a negative feedback resistor 36 is connected between the output terminal of the operational amplifier 30 and a connection point between the capacitors 32 and 34. An example of the pre-amplifier is described in U.S. Pat. No. 5,051,700 (Fox).

Figure 3:
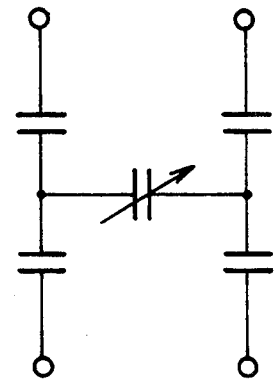
FIG. 3 is a view showing the arrangement of a neutralization circuit according to the first embodiment.

Neutralization circuits 24 are connected between the output terminals of adjacent QD coil assemblies. Each of the neutralization circuits 24 is a capacitor bridge circuit for removing the interference between QD coil assemblies, and is arranged as shown in FIG. 3. The details of the neutralization circuit 24 are described in U.S. Pat. No. 4,769,605 (Fox). Each of the neutralization circuits 24 is not connected between QD coil assemblies which are not adjacent to each other, and need not be connected between an 8-shaped coil and a rectangular coil which constitute one QD surface coil assembly. Large interference between these coil assemblies or coils does not occur. If the values of the resistor 36 and capacitors 32 and 34 of each of the resistance negative feedback type preamplifiers 18 and 20 are properly designed, the interference can be sufficiently reduced to be negligible.

Output signals (outputs from the 90° hybrid combiners 22) from the four QD surface coil assemblies $SC_1$ to $SC_4$ are supplied as raw data, through receiver/data acquisition systems (DASs) 26, to a data processing unit or computer (not shown) which is connected to the output terminals of the receiver/DASs 26, and the raw data are subject to image reconstruction processing.

Figure 4:
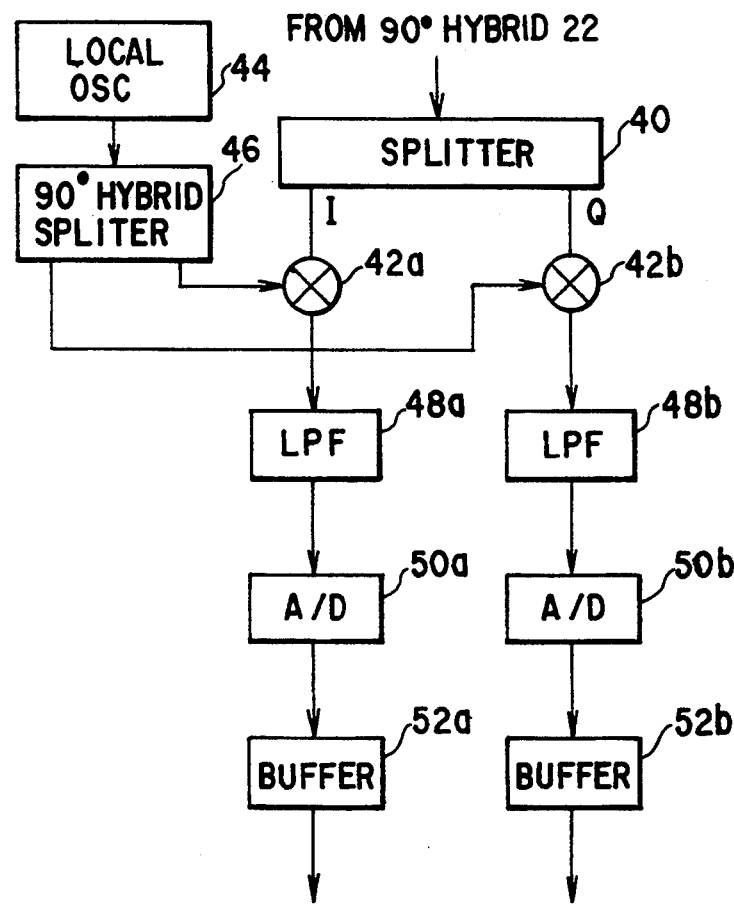
FIG. 4 is a view showing the arrangement of a receiver/DAS according to the first embodiment.
Figure 5:
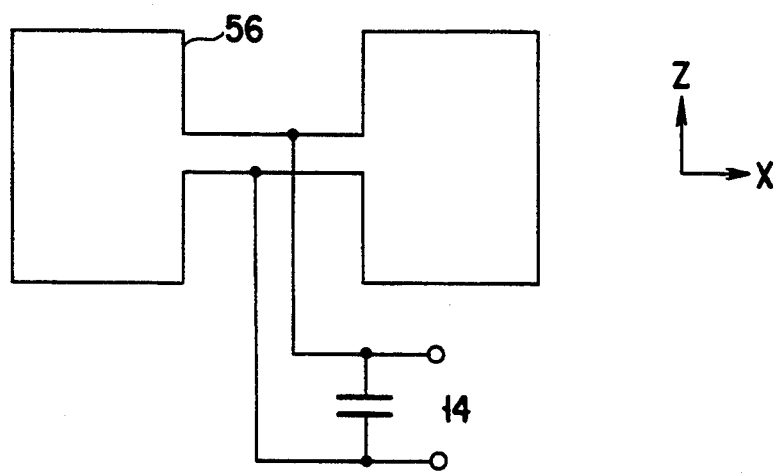
FIG. 5 is a view showing a first modification of an 8-shaped coil forming a QD coil assembly together with a rectangular coil according to the first embodiment.
Figure 6:
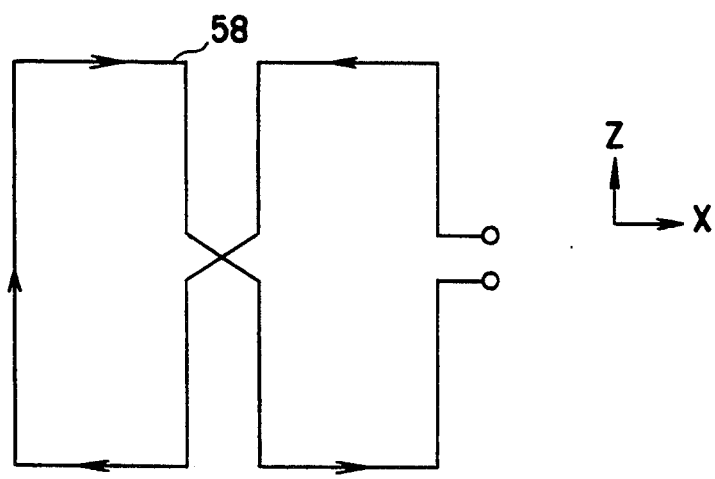
FIG. 6 is a view showing a second modification of the 8-shaped coil according to the first embodiment.
Figure 7:
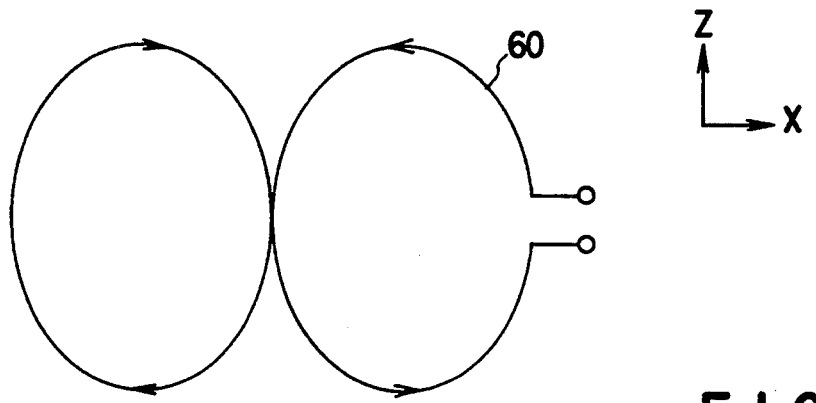
FIG. 7 is a view showing a third modification of the 8-shaped coil according to the first embodiment.
Figure 8:
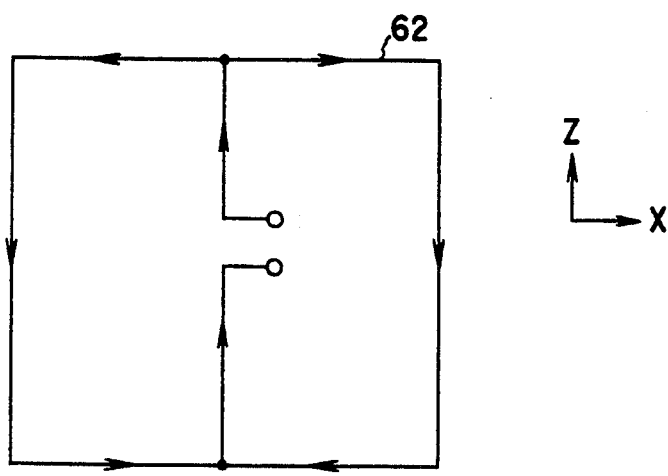
FIG. 8 is a view showing a fourth modification of the 8-shaped coil according to the first embodiment.
Figure 9:
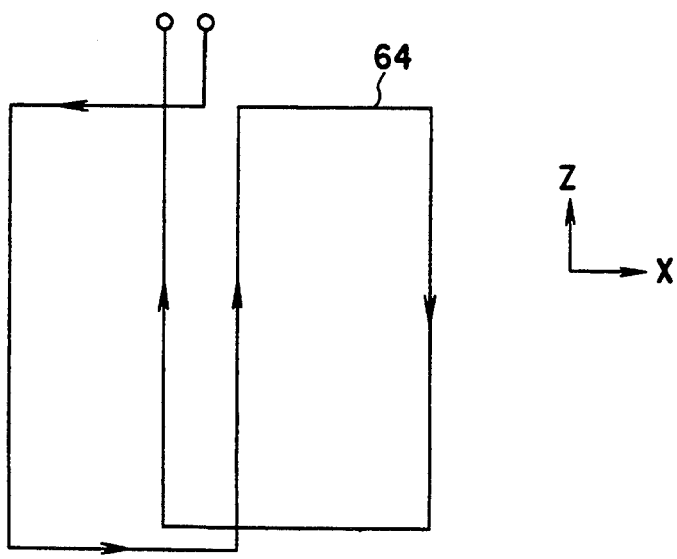
FIG. 9 is a view showing a fifth modification of the 8-shaped coil according to the first embodiment.

Each of the receiver/DASs 26 is constituted as shown in FIG. 4. An output from each of the 90° hybrid combiners 22 is distributed into I and Q signals by a 90° hybrid splitter 40, and these signals are supplied to mixers 42a and 42b, respectively. Reference signals from a local oscillator 44 are supplied to the mixers 42a and 42b through a 90° hybrid splitter 46. Output signals from the mixers 42a and 42b are output through low-pass filters (LPFs) 48a and 48b, A/D converters 50a and 50b, and buffers 52a and 52b, respectively.

The data processing unit (not shown) connected to the output terminals of the receiver/DASs 26 performs image reconstruction as expressed by equation (1). Raw data $RAW_i$ from the surface coil assemblies $SC_i$ (i=1 to 4) are two-dimensionally Fourier-transformed to form image signals $p_i(x,y,z)$. The signals $p_i(x,y,z)$ are squared, the sum of $p_i(x,y,z)$ is calculated with respect to i, and finally, the square root of the sum is calculated.

$$P(x,y,z) = \sqrt{p_1(x,y,z)^2 + p_2(x,y,z)^2 + p_3(x,y,z)^2 + p_4(x,y,z)^2} \quad (1)$$

A summation of the square images $p_1(x,y,z)^2 + p_2(x,y,z)^2 + p_3(x,y,z)^2 + p_4(x,y,z)^2$ has an S/N ratio which is higher than an S/N ratio of any individual images $p_i(x,y,z)$. Squared summation means that each of the images $p_i(x,y,z)$ are suitably weighted and summed so that the final image $P(x,y,z)$ has a maximum S/N ratio. The squared sum image emphasizes a non-uniformity of the sensitivity of each of the QD surface coils so that the final image is obtained from a root of the squared sum image.

Each of the images $p_i(x,y,z)$ obtained from each of the QD surface coils has an S/N ratio about 1.3 times higher than that of the image obtained by a non-QD surface coil. Therefore, the final image $P(x,y,z)$ obtained by the QD surface coil assemblies exhibits an S/N ratio about 1.3 times higher than that of the image obtained by the non-QD surface coil assemblies which are constituted by rectangular or 8-shaped coils arranged one-dimensionaly.

As described in the above mentioned U.S. Pat. No. 4,825,162 it is expected that the S/N ratio of the image obtained by an RF coil constituted by a two-dimensional array of the surface coils is higher than that of the image obtained by an RF coil constituted by a one-dimensional array of the surface coils because an RF signal component, which is perpendicular to an RF signal component received by a central surface coil, is received by lateral surface coils. However, this perpendicular property depends on the coil arrangement and the imaging position and thus cannot always be maintained. According to the present invention, the perpendicular property is perfectedly maintained at x=0 and can be kept at a relatively high level while x is deviated from 0. Therefore, it is expected that the image obtained by a one-dimensional array of the QD surface coils according to the present invention has an S/N ratio substantially equals to that of the image obtained by a two-dimensional array of the non-QD surface coils. The two-dimensional array of the non-QD surface coils has a demerit in which the number of the non-QD surface coils is increased so that the load of the data acquisition systems and the data processing systems is extraordinary increased.

According to the first embodiment, it is possible to reconstruct the image having a high S/N ratio within a short period of time using a simple arrangement while keeping the number of channels of the data acquisition systems and the amount of processed data unchanged by constituting the RF coil by one-dimensionally arranging QD surface coils.

It is known that an image having an S/N ratio higher than that of an image obtained by a single coil is obtained by a QD surface coil assembly in a region in which RF magnetic fields each having a sensitivity of the coils 10 and 12 are perpendicular to each other and in which the S/N ratios of the coils are almost equal to each other. In general, the pattern of sensitivity distribution of a rectangular coil is different from that of an 8-shaped coil, and the S/N ratios of two images independently obtained from the two coils are largely different from each other at a portion adjacent to the coils or a portion farthest from the coils (the value of y is considerably large or small). In addition, although a condition in which the directions of the RF magnetic fields generated by the two coils are perpendicular to each other is easily satisfied on a common central axis of both the coils, the orthogonal characteristics are degraded at positions other than the common central axis. However, a spine array of interest can be practically set near a portion of x=0 without any problem. The geographic shapes and sizes of both the coils can be sufficiently designed such that the S/N ratios of images independently obtained by respectively functioning the rectangular coil and the 8-shaped coil at the y position of the spine array are almost equal to each other.

The QD surface coil assembly constituted by a rectangular coil and an 8-shaped coil has been described above. However, not only the rectangular coil but also a circular coil may be used as a coil for generating an RF magnetic field in the y direction, and 8-shaped coils 56, 58, 60, 62, and 64 shown in FIGS. 5 to 9 may be used as a coil for generating an RF magnetic field in the x direction.

Figure 10:
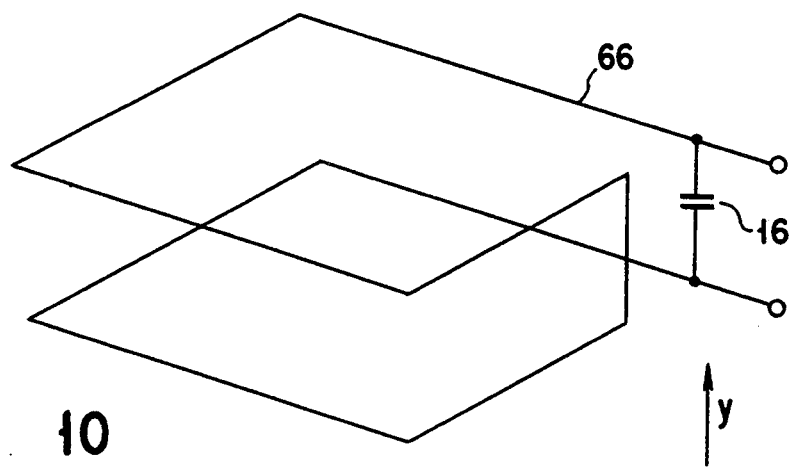
FIG. 10 is a view showing a modification of the rectangular coil forming a QD coil assembly together with the 8-shaped coil according to the first embodiment.

When a differential coil 66 shown in FIG. 10 is used as the rectangular coil, magnetic field coupling between the rectangular coil and an external circuit can be further reduced.

Figure 11:
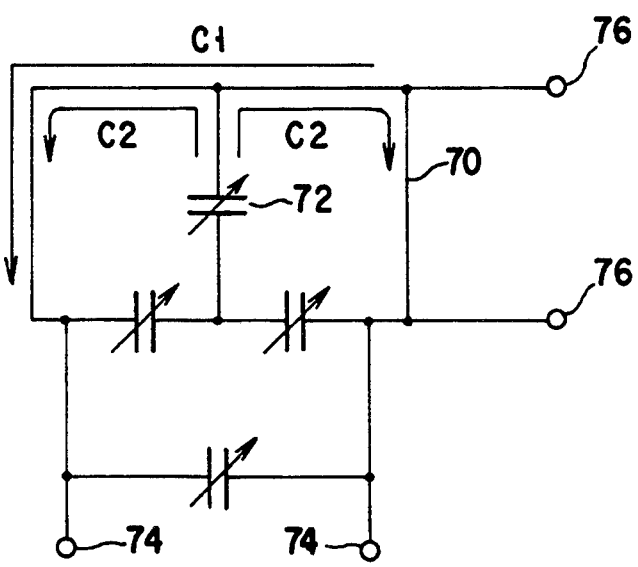
FIG. 11 is a view showing a modification of a surface quadrature coil assembly according to the first embodiment.

Although the QD surface coil assembly is constituted by two coils, the QD surface coil assembly can be constituted by one 8-shaped coil 70 as shown in FIG. 11. The 8-shaped coil 70 has a series mode C1 in which no current flows in a central capacitor 72 and a parallel mode C2 in which a current flows in the capacitor 72, and the 8-shaped coil 70 forms RF magnetic fields having a sensitivity in perpendicular directions as in the coil assembly constituted by a rectangular coil and an 8-shaped coil. When two signals C1 and C2 corresponding to the perpendicular RF magnetic fields are output, one of the signals C1 and C2 can correspond to an output from the rectangular coil, and the other can correspond to an output from the 8-shaped coil. The series mode signal C1 is obtained from an output terminal 74, and the parallel mode signal C2 can be obtained from an output terminal 76.

Another embodiment of the present invention will be described below.

Figure 12:
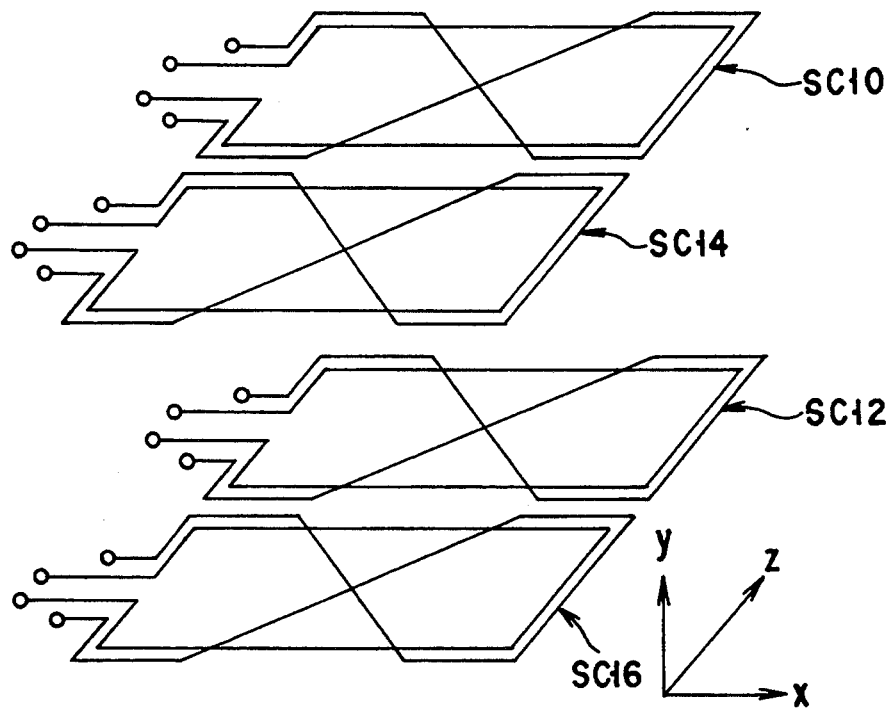
FIG. 12 is a view showing the arrangement of RF coils in a magnetic resonance imaging apparatus according to a second embodiment of the present invention.

In the first embodiment, the QD surface coil assemblies are one-dimensionally arranged along an body axis under the spine array of an object to be examined. However, in the second embodiment, as shown in FIG. 12, a pair of QD surface coil assemblies $SC_{10}$ and $SC_{12}$ is arranged opposite to each other through an object to be examined. The pair of opposite surface coil assemblies $SC_{10}$ and $SC_{12}$ and a pair of opposite surface coil assemblies $SC_{14}$ and $SC_{16}$ are arranged in the direction of the body axis. In this embodiment, the two pairs of opposite surface coil assemblies are arranged. An object (patient) to be examined is inserted in a space between the coil assemblies arranged opposite to each other. According to the second embodiment, not only a surface region but also a trunk portion of the object can be imaged at a high S/N ratio.

Although QD surface coils are one-dimensionally arranged in the above embodiment, the present invention can be applied to not only a case wherein the QD surface coils are arranged but also a case wherein volume coils are one-dimensionally arranged. For example, so-called saddle coil assemblies obtained by arranging coils to surround the object are used as the volume coil assembly. A QD volume coil assembly obtained by arranging the saddle coil assemblies in directions perpendicular to each other is shown in FIG. 13. The QD volume coil assembly is constituted by a saddle coil assembly of a channel A indicated by the thick line in FIG. 13 and a saddle coil assembly of a channel B indicated by the thin line in FIG. 13. An image having a high S/N ratio can be generally obtained by the saddle coil assembly. It is known that a higher S/N ratio can be obtained when the length of the coil assembly is decreased in a z-axis direction. In this case, however, the length of a sensitivity region is too short in the z-axis direction to cover an entire region of interest.

Therefore, according to a third embodiment, as shown in FIG. 14, the lengths of QD volume coil assemblies 80 and 82 are shortened in the z-axis direction. To compensate for this, a plurality of QD volume coil assemblies 80 and 82 are arranged in the z-axis direction (the two coil assemblies are arranged in this embodiment).

FIG. 15 is a block circuit diagram in which the coil winding portions in FIG. 14 are developed on a plane and circuits are drawn. Two receiver/DASs 84 and 86 are required because two QD volume coil assemblies 80 and 82 are arranged.

Signal outputs from the two QD volume coil assemblies 80 and 82 obtained as described above are supplied as raw data to a data processing unit through the two receiver/DASs 84 and 86. The data processing unit performs image reconstruction as expressed by equation (2). The raw data $RAW_i$ (i=1 to 2) from the QD volume coil assemblies 80 and 82 are two-dimensionally Fourier-transformed to form image signals $p_i(x,y,z)$. The images $p_i(x,y,z)$ are squared, the sum of squared images $pi(x,y,z)$ is calculated with respect to i, and finally, the square root of the sum is calculated.

$$P(x,y,z) = \sqrt{\{p_1(x,y,z)^2 + p_2(x,y,z)^2\}} \quad (2)$$

Figure 16:
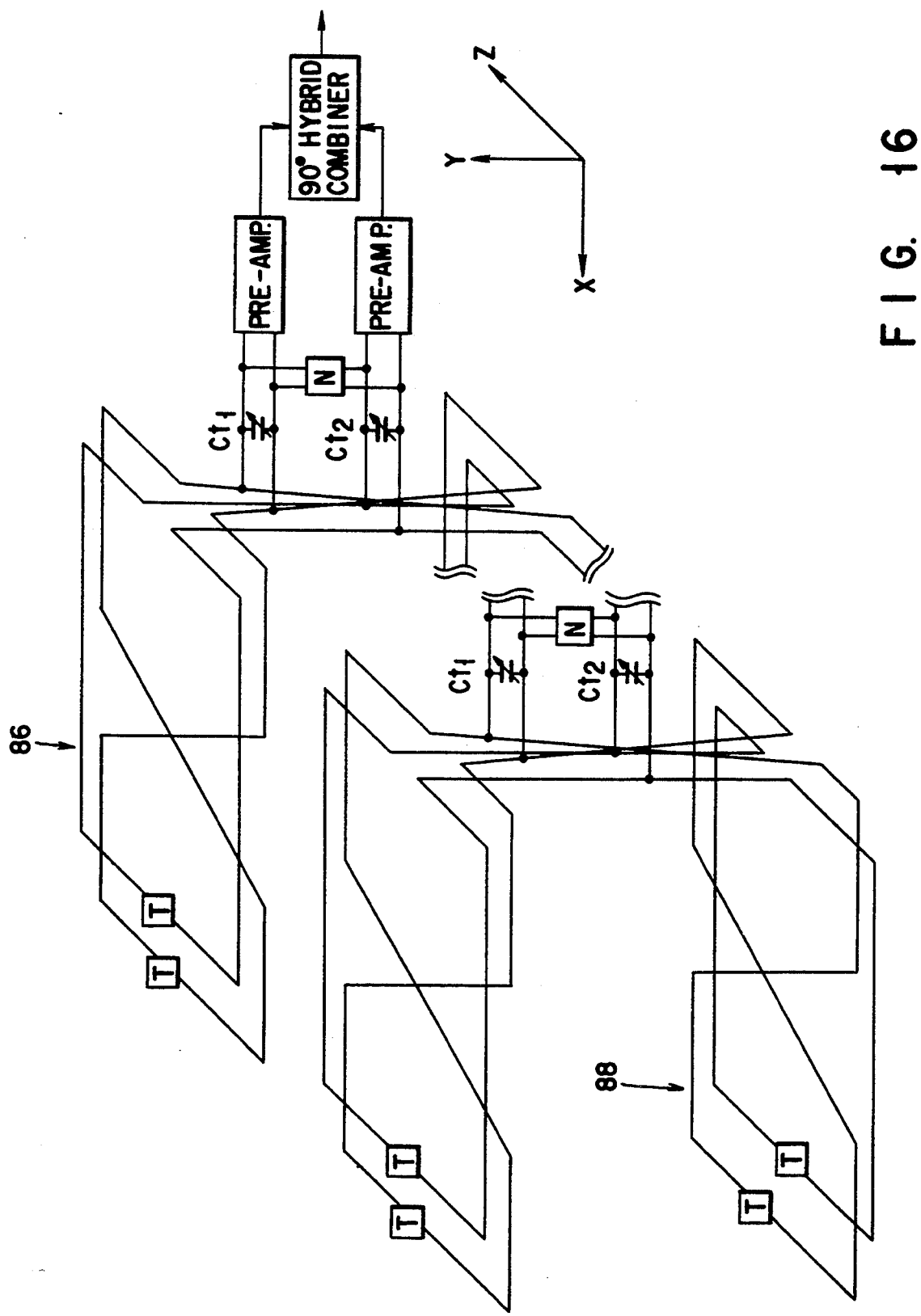
FIG. 16 is a view showing the arrangement of RF coils in a magnetic resonance imaging apparatus according to a fourth embodiment of the present invention.

A fourth embodiment relating to the modification of the shape of the volume coil will be described. The shape of the volume coil is generally a cylindrical one to surround the patient. However, when the pairs of QD surface coil assemblies $SC_{10}$ and $SC_{12}$; $SC_{14}$ and $SC_{16}$ are connected to each other, QD coil assemblies 86 and 88 which can be regarded as volume coil assemblies sandwiching the patient are realized. FIG. 16 shows the fourth embodiment in which these QD coil assemblies 86 and 88 are one-dimensionally arranged in the direction of the body axis.

Figure 17:
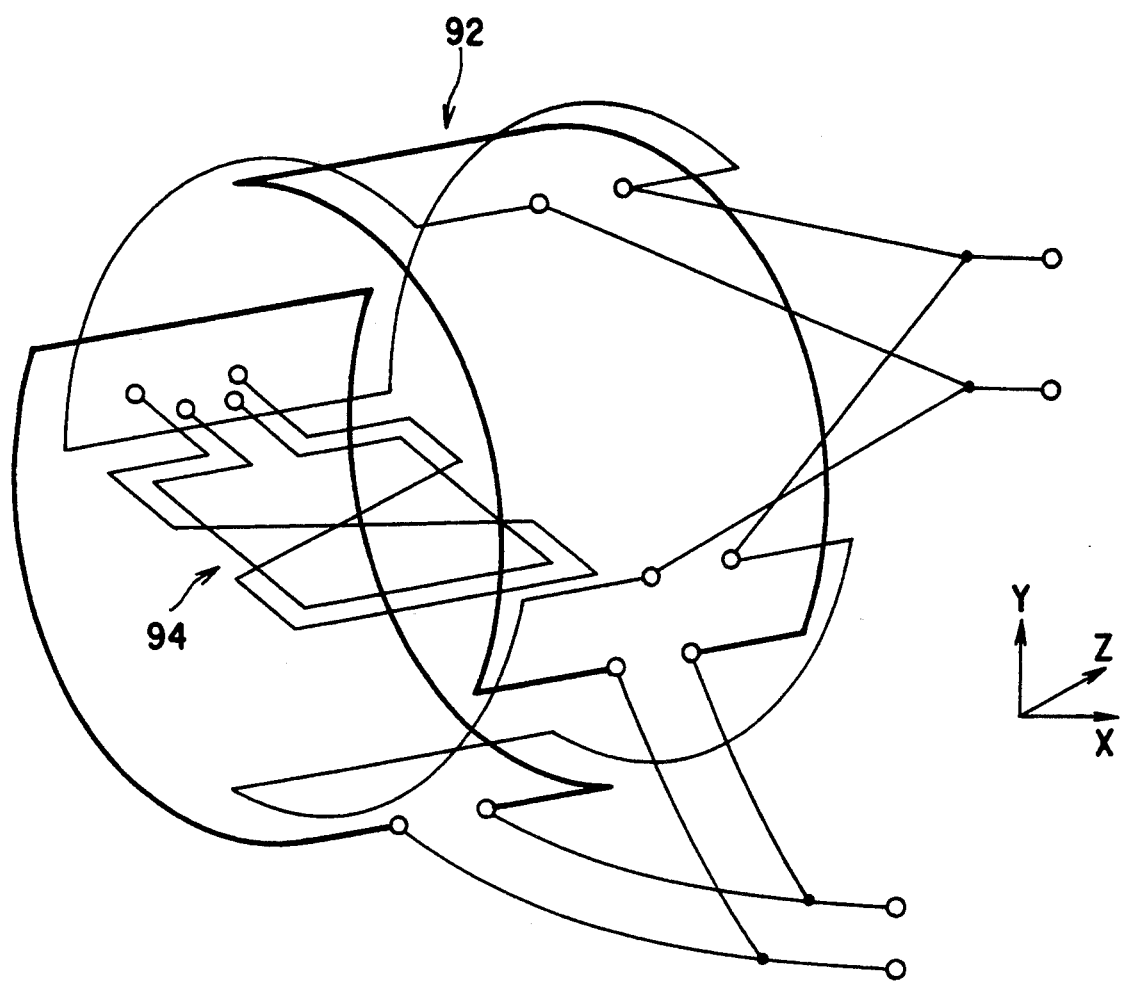
FIG. 17 is a view showing the arrangement of RF coils in a magnetic resonance imaging apparatus according to a fifth embodiment of the present invention.

FIG. 17 shows a fifth embodiment in which a QD surface coil assembly 94 and a QD volume coil assembly 92 are combined and the outputs of the QD surface coil assembly 94 and the QD volume coil assembly 92 are acquired at the same time. An image capable of obtaining a high S/N ratio near the surface region by means of the QD surface coil assembly 94 and obtaining an appropriate S/N ratio by means of the QD volume coil assembly 92 even at a portion far from the QD surface coil assembly 92 without considerably decreasing a sensitivity can be reconstructed by the above image synthesizing method.

Though not shown in the drawings, it is possible to arrange the combination of the assemblies 92 and 94 in the direction of the body axis. The sensitivity variations essentially depend on QD surface coil assemblies 94 occur in an-image formed by the QD surface coil assemblies. However, if data acquisition is performed by the QD volume coil assemblies, the image obtained by the QD surface coil assemblies can be corrected to be an image having uniformity as that of an image having a uniform sensitivity distribution and obtained by the QD volume coil assemblies. That is, the image obtained by the surface coil assemblies may be corrected in a data processing system so as to have a signal intensity distribution as that of the image obtained by the QD volume coil assembly.

As described above, according to the present invention, an RF coil group in which QD surface coil assemblies or QD volume coil assemblies are one-dimensionally arranged in the direction of the body axis of the object is used, two signals from the coil elements forming a QD coil assembly are synthesized to obtain one signal, and an image is reconstructed on the basis of the synthesized signal. In this manner, there is provided a magnetic resonance imaging apparatus capable of obtaining an image having an amount of acquisition data and an amount of processing data which are half those of an image obtained when only one of the two coil elements constituting the QD coil assembly is two-dimensionally arranged and signals from the coil elements are independently acquired to reconstruct the image. The S/N ratio of the image obtained according to the present invention is equal to that of the image obtained when coil elements are two-dimensionally arranged.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, when volume coil assemblies are to be used, it is not necessary to form a QD volume coil assembly. Plural short saddle coils may be arranged along a body axis of the patient (z-axis). In this case, although an S/N ratio is lower than that of the QD coil assembly, an image having a relatively high S/N ratio and an effective sensitivity region whose length in the z-axis direction is large can be obtained by a simple arrangement. An image obtained by a short saddle coil has an S/N ratio higher than that obtained by a long saddle coil. However, the short saddle coil has a demerit of a short effective sensitivity length. Thus, plural short saddle coils are arranged along the body axis to have a higher S/N ratio and a longer effective sensitivity length.

A saddle coil assembly has been exemplified as a volume coil assembly, a crossed-elliptic coil assembly or a slotted-tube-resonator type coil assembly is well known as a volume coil assembly. These coil assemblies can be applied to the present invention. In this case, the coil assemblies may constitute a QD coil assembly.

What is claimed is:

1. A magnetic resonance imaging apparatus for receiving radio frequency signals generated by an object to be imaged; said apparatus comprising:
   a radio-frequency coil array formed of a plurality of radio-frequency coil assemblies arranged in at least one dimension, each radio-frequency coil assembly for receiving radio-frequency signals from two directions perpendicular to each other generated at a predetermined portion of the object and for generating two output signals in response thereto;
   each radio-frequency coil assembly having an associated means for shifting a phase of one of the two output signals by about 90° and for synthesizing the two output signals to obtain one synthesized signal;
   means for substantially simultaneously operating at least two of said plurality of radio-frequency coil assemblies to generate substantially simultaneously at least two synthesized signals; and
   means for reconstructing an image of the object on the basis of said at least two synthesized signals.

2. An apparatus according to claim 1, wherein said plurality of radio-frequency coil assemblies are arranged in a body axis direction of the object; and
   each of said plurality of radio-frequency coil assemblies is formed of a substantially circular or rectangular surface coil having a sensitivity for receiving radio-frequency signals in a horizontal direction perpendicular to the body axis and a substantially 8-shaped conductor having a sensitivity for receiving radio-frequency signals in a vertical direction perpendicular to the body axis.

3. An apparatus according to claim 2, wherein said surface coil is a differential type surface coil.

4. An apparatus according to claim 1, wherein each of said plurality of radio-frequency coil assemblies is formed of a substantially 8-shaped single coil, having two resonance modes, for generating the two output signals each corresponding to a resonance mode.

5. A magnetic resonance imaging apparatus for receiving radio-frequency signals generated by an object to be imaged, said apparatus comprising:
   a radio-frequency coil array formed of at least two pairs of radio-frequency coil assemblies arranged in at least one dimension, each pair of said radio-frequency coil assemblies is positioned with the object therebetween, and having a sensitivity for receiving two radio-frequency signals in two directions perpendicular to each other at a predetermined portion of the object, and for generating two output signals corresponding to the two radio-frequency signals received;
   each pair of radio-frequency coil assembly having an associated means for shifting a phase of one of the two output signals by about 90° and for synthesizing the two output signals to obtain one synthesized signal;
   means for substantially simultaneously operating said at least two pairs of said radio-frequency coil assemblies to substantially simultaneously acquire a plurality of synthesized signals; and
   means for reconstructing an image of the object on the basis of the plurality of synthesized signals.

6. An apparatus according to claim 5, wherein said at least two pairs of said radio-frequency coil assemblies are arranged in a body axis direction of the object; and
   each of the pair of said radio-frequency coil assemblies is formed of a substantially circular or rectangular surface coil having a sensitivity for receiving radio-frequency signals in a horizontal direction perpendicular to the body axis and a substantially 8-shaped conductor having a sensitivity for receiving radio-frequency signals in a vertical direction perpendicular to the body axis.

7. An apparatus according to claim 6, wherein said surface coil is a differential type surface coil.

8. A magnetic resonance imaging apparatus for receiving radio-frequency signals generated by an object to be imaged; said apparatus comprising:
   plural volume coil assemblies arranged in an axis of the object said assemblies positioned to surround the object and for receiving radio-frequency signals generated by the object and for producing plural output signals in response thereto;
   means for substantially simultaneously operating said plural volume coil assemblies to substantially simultaneously acquire said plural output signals from said plural volume coil assemblies; and
   means for reconstructing an image of the object on the basis of the plural output signals from said plural volume coil assemblies which are simultaneously acquired.

9. An apparatus according to claim 8, wherein each of said volume coil assemblies has a sensitivity for receiving radio-frequency signals from two directions perpendicular to each other at a predetermined portion of the object and for producing two output signals corresponding to the two radio-frequency signals.

10. An apparatus according to claim 9, further comprising:
    means for shifting a phase of one of two output signals from each of said volume coil assemblies by about 90° an synthesizing the two output signals to obtain one synthesized signal.

11. A magnetic resonance imaging apparatus for receiving radio-frequency signals generated by an object to be imaged; said apparatus comprising:
    a radio-frequency volume coil array formed of at least two radio-frequency volume coil assemblies arranged in a direction of a body axis of the object, each of the radio-frequency volume coil assemblies being formed of two radio-frequency coil assemblies sandwiching the object, and each of the volume radio-frequency coil assemblies having a sensitivity for receiving radio-frequency signals in two directions perpendicular to each other at a predetermined portion of the object and for producing two output signals corresponding to the two radio-frequency signals in response thereto;

each volume coil assembly having an associated means for shifting a phase of one of two output signals by about 90° and synthesizing the two output signals to obtain one synthesized signal;

means for substantially simultaneously operating said at least two radio-frequency volume coil assemblies to substantially simultaneously acquire a plurality of synthesized signals; and means for reconstructing an image of the object on the basis of the plurality of synthesized signals which are simultaneously acquired.

12. A magnetic resonance imaging apparatus for receiving radio-frequency signals generated by an object to be imaged; said apparatus comprising:

a radio-frequency surface coil assembly formed of two radio-frequency surface coil assemblies, having a sensitivity for receiving radio-frequency signals in two directions perpendicular to each other at a predetermined portion of the object and for producing two surface output signals corresponding to the two radio-frequency signals received;

a radio-frequency volume coil assembly formed of two radio-frequency coil assemblies surrounding the object, having a sensitivity for receiving radio-frequency signals in two directions perpendicular to each other at a predetermined portion of the object and for producing two volume output signals corresponding to the two radio-frequency signals received;

first synthesizing means for shifting a phase of one of two surface output signals by about 90° and for synthesizing the two surface output signal to obtain a first synthesized signal;

second synthesizing means for shifting a phase of one of two volume output signals by about 90° and for synthesizing the two volume output signals to obtain a second synthesized signal;

means for substantially simultaneously operating said radio-frequency surface coil assembly and said radio-frequency volume coil assembly to substantially simultaneously acquire the first and second synthesized signals; and means for reconstructing an image of the object on the basis of the first and second synthesized signals which are simultaneously acquired.

* * * * *